United States Patent
Lee et al.

(10) Patent No.: US 6,605,535 B1
(45) Date of Patent: Aug. 12, 2003

(54) METHOD OF FILLING TRENCHES USING VAPOR-LIQUID-SOLID MECHANISM

(75) Inventors: Jack Lee, Nan-To (TW); Peter Luo, Pen-Hu (TW)

(73) Assignee: ProMos Technologies, Inc, Hsin-Chu (TW)

( * ) Notice: Subject to any disclaimer, the term of this patent is extended or adjusted under 35 U.S.C. 154(b) by 0 days.

(21) Appl. No.: 10/256,051

(22) Filed: Sep. 26, 2002

(51) Int. Cl.⁷ .......................... H01L 21/44; C30B 15/00; C30B 11/00
(52) U.S. Cl. ...................... 438/684; 438/682; 438/683; 117/25; 117/73
(58) Field of Search .................................. 438/682, 684, 438/675, 678, 685, 683; 117/25, 73

(56) References Cited

U.S. PATENT DOCUMENTS

| | | | |
|---|---|---|---|
| 4,589,196 A | * | 5/1986 | Anderson |
| 5,207,263 A | | 5/1993 | Maier et al. ................ 164/97 |
| 5,314,569 A | * | 5/1994 | Pribat et al. |
| 5,362,972 A | | 11/1994 | Yazawa et al. .............. 257/13 |
| 5,814,290 A | | 9/1998 | Niu et al. .................... 423/344 |
| 6,274,489 B1 | * | 8/2001 | Ono et al. |
| 6,329,256 B1 | * | 12/2001 | Ibok |
| 6,451,113 B1 | * | 9/2002 | Givargizov |

OTHER PUBLICATIONS

R. Wagner and W. Ellis in Applied Phys. Letters, vol. 4, No. 5, pp. 89–90, (1964), "Vapor–Liquid–Solid Mechanism of Single Crystal Growth."

* cited by examiner

Primary Examiner—Ha Tran Nguyen
(74) Attorney, Agent, or Firm—George O. Saile; Stephen B. Ackerman

(57) ABSTRACT

A method of filling trenches such as a DT cell with silicon is described that involves a vapor-liquid-solid (VLS) mechanism. First, a thin film of Si is grown on the trench sidewalls. Seed metal such as Au, Ni or Ni alloy is deposited on the sidewalls by an electroless plating process. A thermal treatment is then used to reflow the metal to a liquid state art the trench bottom. A Si precursor gas is applied to grow a single whisker that fills the trench. Silicon overgrowth is removed by an etch or CMP step. The method can also be applied to filling a via hole with silicide. In this case the seed metal is Ti, Co, or Ni which is reflowed by a thermal treatment. A silicon source gas like $SiCl_4$ is combined with $H_2$ to grow the silicide layer. This method is especially useful in forming seamless fill layers.

20 Claims, 4 Drawing Sheets

METHOD OF FILLING TRENCHES USING VAPOR-LIQUID-SOLID MECHANISM

FIELD OF THE INVENTION

The invention relates to the field of fabricating semiconductor devices and other electronic devices, and more particularly to method of filling trenches or via holes with a uniform layer of semiconductive or conductive material.

BACKGROUND OF THE INVENTION

Two features that are repeatedly formed during semiconductor processing are trenches and via holes in order to fabricate interconnects or different types of cells in a device. The process of fabricating these features typically involves patterning a photoresist layer and then using the photoresist as a mask while the pattern is etched into one or more underlying layers. One characteristic of trenches, especially those in a deep trench (DT) pattern, is a high aspect ratio in which the height of the trench is several times the width of the opening. This relationship requires low edge roughness and high etch resistance in the photoresist so that smooth sidewalls can be formed in the etched trench pattern. Furthermore, the etch should be anisotropic and be able to generate vertical profiles in the etched pattern.

Another challenging aspect of semiconductor processing is filling trenches and via holes with a uniform layer of material that is free of voids and seams. This process is becoming increasingly difficult as the size of trench and via openings shrinks in order to keep pace with a constant demand for higher performance in semiconductor devices. When interconnects are filled with a conductive material, a metal or metal alloy involving copper, aluminum, or tungsten is generally deposited although metal suicides are also good conductors. Deposition is accomplished by electroplating, evaporating or sputtering methods.

DT cells are commonly filled with a material like silicon. Seams can easily form in the deposited material inside the trench. As a result, the manufacturing process will be more expensive because the defective substrates will have to be reworked or scrapped. When the defects go undetected, then there will be a loss of performance in the final device. Therefore, it is desirable to employ a reliable method of filling holes and trenches that does not form seams and can be implemented in a cost effective manner.

A vapor-liquid-solid (VLS) mechanism of single crystal growth is proposed by R. Wagner and W. Ellis in Applied Phys. Letters, Vol. 4, No. 5, p. 89 (1964). This paper reports the growth of a 0.2 micron single crystal or whisker of silicon on a Si substrate by using a Au particle as a seed material and a $SiCl_4$ vapor as a silicon source that is reduced by $H_2$. The authors postulate that a liquid alloy droplet is formed on the Au impurity. Vapor deposition occurs on the droplet and the liquid becomes supersaturated with silicon. Silicon precipitation causes the whisker to grow and the alloy droplet is believed to "ride" on top of the whisker as it grows.

Since then the VLS mechanism has been applied for industrial uses. In U.S. Pat. No. 5,207,263, a VLS silicon carbide whisker is combined with a metal in a squeeze casting process to form a reinforced metal composite. The SiC whisker is characterized by a high length/width aspect ratio. Silica, alumina, carbon, and boron are mentioned as other sources of VLS growth.

A silicon nitride nanowhisker is described for use in ceramics applications in U.S. Pat. 5,814,290. A nanowhisker with a diameter of from 30 to 200 nm and a length of greater than a millimeter can be formed with straight needle-like morphology by reacting gaseous SiO and nitrogen at elevated temperature and pressure. The nanowhiskers are grown in the presence of carbon nanotubes in a temperature range of from 1200° C. to 1400° C.

U.S. Pat. No. 5,362,972 describes the formation of a semiconductor whisker channel by organometallic vapor phase (MOCVD) epitaxy. An n-type InAs whisker is grown on a GaAs or InP substrate and becomes a gate in a field effect transistor. In another embodiment, an InGaAs gate with a gate length of 50 nm is formed. The whisker growth is controlled by the supply rate of arsine which is thermally decomposed at about 400° C. during the reaction with implanted gallium or indium ions. A typical growth time is about 200 seconds. These whiskers provide higher electron mobility than gates formed by conventional methods.

SUMMARY OF THE INVENTION

An objective of the present invention is to provide a method for filling trenches and via holes without forming seams that will improve reliability of the final device.

A further objective of the present invention is to provide a method of filling trenches that can be readily implemented in manufacturing using existing tools.

These objectives are achieved by employing a VLS process for filling a trench or via hole. In one embodiment, a thin film of silicon that is optionally doped with arsenic is grown on the walls of a trench. A seed material such as Au, Ni, Co or an alloy of one of the aforesaid metals is deposited on the trench walls by electroless plating. A heat treatment is then used to reflow the seed material to a liquid state at the bottom of the trench. A silicon precursor gas such as $SiCl_4$ and $H_2$ is introduced to grow the Si within the trench and form a seamless silicon whisker. Optionally, an etch or a chemical mechanical polish (CMP) step is applied to lower the Si growth to a level that is coplanar with the top of the trench.

In a second embodiment, a layer of silicon is deposited by chemical vapor deposition (CVD) on the sidewalls of a via hole or trench and then a seed material such as Ni, Ti, or Co or an alloy of one of these metals is deposited on the silicon layer by electroless plating. The seed material and the silicon layer are each from 500 to 1000 Angstroms thick and are reflowed by a heat treatment to provide a liquid comprised of a silicide that has a metal silicon ratio slightly larger than 1. The silicide fills most of the via hole or trench. Then a silicon precursor gas such as $SiCl_4$ and $H_2$ is applied to adjust the metal/silicon ratio to a targeted value and grow the silicide to form a seamless silicide layer. Optionally, an etch or CMP step is used to lower the overgrown silicide to a level that is coplanar with the top of the opening.

DETAILED DESCRIPTION OF THE INVENTION

Preferred embodiments of the present invention will be described with reference to the accompanying drawings. Numbered elements are not necessarily drawn to scale and the drawings are not intended to limit the scope of the invention.

Figure 1A:
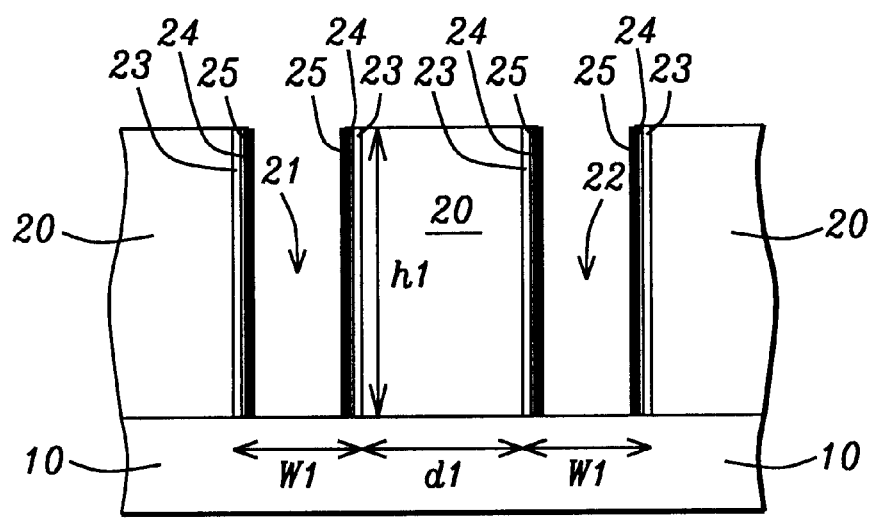
FIG. 1a is a cross-sectional view of a deep trench after a thin silicon layer has been deposited on the sidewalls of the trenches according to a method of the present invention.

In one embodiment, the present invention is a method of filling a trench with silicon in a way that does not produce seams. Seams are thin vertical or horizontal crevices formed within the trench filler material because of the nature of the deposition process. Seams are considered defects that lead to a degradation in device performance. This embodiment relates to a deep trench (DT) cell but can apply to other types of trenches as well. Referring to FIG. 1a, a substrate 10 is provided which is typically silicon but may also be silicon-germanium, gallium-arsenide, or a silicon-on-insulator (SOI) substrate. Substrate 10 may also be comprised of a substructure (not shown) that can include conductive and dielectric layers as well as active and passive devices. A silicon layer 20 is deposited on substrate 10 by a process such as CVD and deep trenches 21, 22 are formed in layer 20 by a conventional method that typically involves patterning a photoresist layer (not shown) and etching the pattern into silicon layer 20. Trenches 21, 22 have a depth h1 that ranges from about 7 to 8 microns and are separated by a distance d1 that varies from about 0.1 to 0.8 microns. The width w1 of the trench opening 21, 22 is normally submicron in size and can approach 0.1 microns (1000 Angstroms) in advanced products.

A thin film of silicon nitride 23 is deposited on the sidewalls of trenches 21, 22 by a CVD method to give a film thickness in the range of about 30 to 40 Angstroms. Next a thin film of silicon oxide is deposited by a CVD process to provide a layer 24 with a thickness in the range of about 10 to 20 Angstroms.

A thin film of silicon 25 approximately 50 to 100 Angstroms thick is then grown on the sidewalls of the trenches 21, 22 by a CVD technique using $SiCl_4$ as a source gas in a gas mixture including hydrogen. Optionally, the silicon 25 can be doped with arsenic to give an As concentration of between $1 \times 10^{22}$ and $3 \times 10^{22}$ ions/cm$^3$ in the silicon film. The silicon film 25 protects adjacent silicon nitride 23 and silicon oxide 24 layers during subsequent processing. The arsenic can be deposited in the CVD process to form layer 25 or the arsenic can be implanted into silicon layer 25. An activation anneal is not necessary before the VLS growth described below but may be added after the VLS process.

Figure 1B:
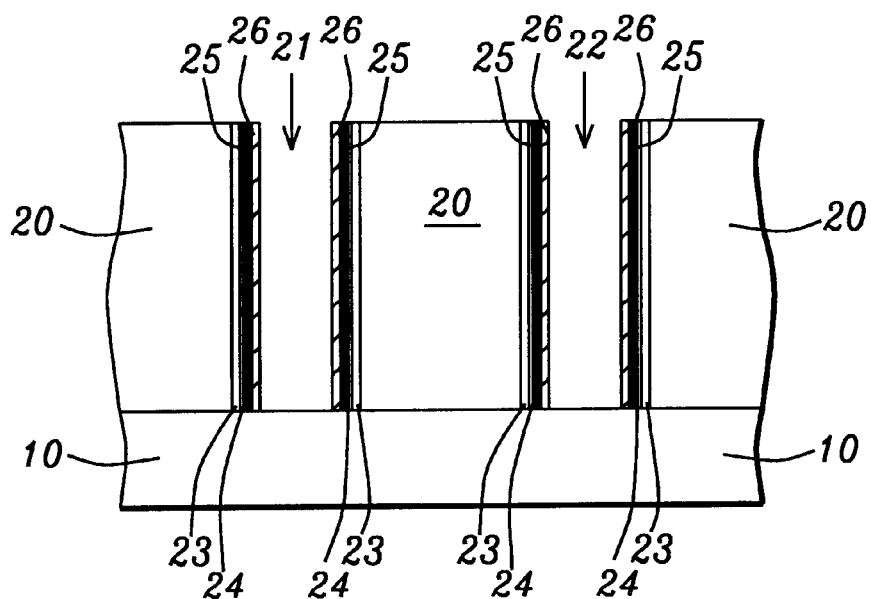
FIG. 1b is a cross-sectional view of the structure depicted in FIG. 1a after a seed layer has been deposited on the sidewalls.

As shown in FIG. 1b, a seed material 26 comprised of a metal selected from a group including Au, Ni, and Co or an alloy thereof is deposited on the silicon layer 25 within the trench walls by an electroless plating process to give a metal film thickness within each trench 21, 22 in the range of between about 50 and 100 Angstroms. Although a high quality and low cost Au, Ni or Co seed material is formed by electroless plating, other methods can also be employed to form the seed layer 26. Typically, the substrate 10 is cleaned by a process comprised of DI water following the electroplating to ensure that the surfaces within the trenches 21, 22 are free of chemicals prior to the next step.

Figure 1C:
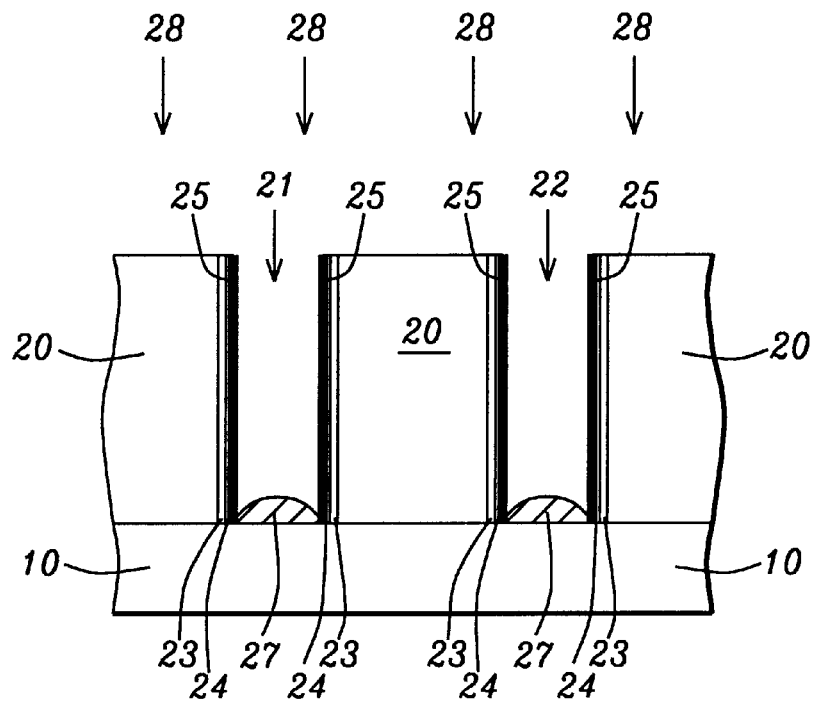
FIG. 1c is a cross-sectional view of the structure shown in FIG. 1b after a heat treatment is used to reflow the metal seed layer.

Referring to FIG. 1c, the seed material 26 and some of silicon layer 25 are reflowed to a liquid state by a thermal treatment that involves heating the substrate 10 in a furnace chamber under an inert gas ambient that is preferably argon to a temperature in the range of 500° C. to 1000° C. for a period of 10 to 60 seconds. The metal 26 and some of silicon layer 25 on the trench sidewalls flows to the bottom of the trenches 21, 22 as a liquid 27. This liquid 27 then serves as a seed for the VLS process to grow a whisker that may be a single crystal of silicon.

A silicon precursor gas 28 is applied in a CVD chamber containing substrate 10. For example, $SiCl_4$ at a flow rate of 250 to 400 standard cubic centimeters per minute (sccm) and $H_2$ at a flow rate of 50 to 100 sccm are introduced into the chamber at a pressure of between 0.04 and 0.4 Torr and with a temperature in the range of 500° C. to 1000° C. Other silicon source gases such as $SiCl_2H_2$ can be used in combination with $H_2$. The CVD process is continued until the silicon growth 29 completely fills the trenches 21, 22 and grows above the top of the trenches. The seed liquid 27 is believed to "ride" above the whisker growth 29. Although a conventional CVD process usually requires hours to complete, the VLS method for growing whisker 29 is at least 100 times faster than a standard Si deposition.

Figure 1D:
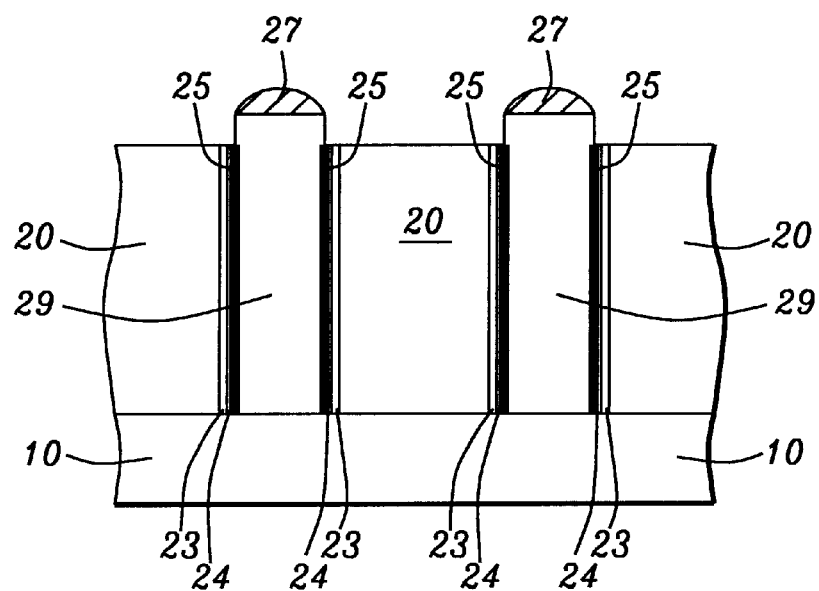
FIG. 1d is a cross-sectional view of the trenches in FIG. 1c after a silicon whisker is grown in the trenches by a VLS process.

Referring to FIG. 1d, a silicon whisker 29 is formed that is essentially a single crystal that is free of defects and seams which is an improvement over other methods such as conventional CVD that has a tendency to form seams or voids during the deposition process. Silicon growth by a VLS mechanism is able to form a single whisker with a high aspect ratio (h1/w1) that is free of defects. Furthermore, impurities such as arsenic can be doped into the silicon whisker as n-type Si to increase the conductivity. Because of the defect reduction, there are fewer substrates that must be reworked or scrapped and the resulting yield is higher.

Figure 1E:
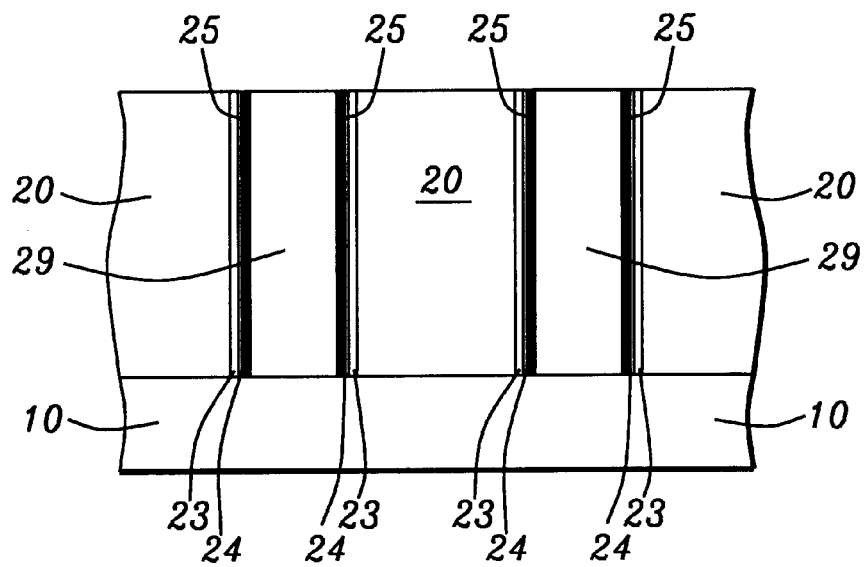
FIG. 1e shows that the single whisker in each of the trenches in FIG. 1d has been planarized.

Referring to FIG. 1e, an optional step is performed that removes the silicon overgrowth to provide a level of silicon 29 that is coplanar with the top of trenches 21, 22. Planarization can be achieved by one of two methods. A CMP technique that is commonly used in dual damascene fabrication can be employed. Otherwise, an etch step that includes a chemical solution known to those skilled in the art can be employed to selectively remove the seed and silicon whisker to lower the silicon overgrowth.

The entire method of the first embodiment can be readily implemented in manufacturing since it makes use of existing tools and processes including electroplating, CVD, CMP, and high temperature baking techniques.

In a second embodiment, the present invention is a method of filling an opening such as a via hole or trench with a silicide in a way that does not produce seams or defects. This embodiment is depicted in FIGS. 2a–2d as it relates to a single via hole but can apply to other hole patterns as well. For instance, the hole pattern may contain regions of dense arrays where the holes are separated by a distance that is about equal to the space width within the hole. There may be regions containing isolated holes in the same pattern as dense hole regions. The arrays of dense and isolated holes can extend in both x and y directions where the (x,y) grid is the plane of the substrate and is bounded by the edge of the substrate.

Figure 2A:
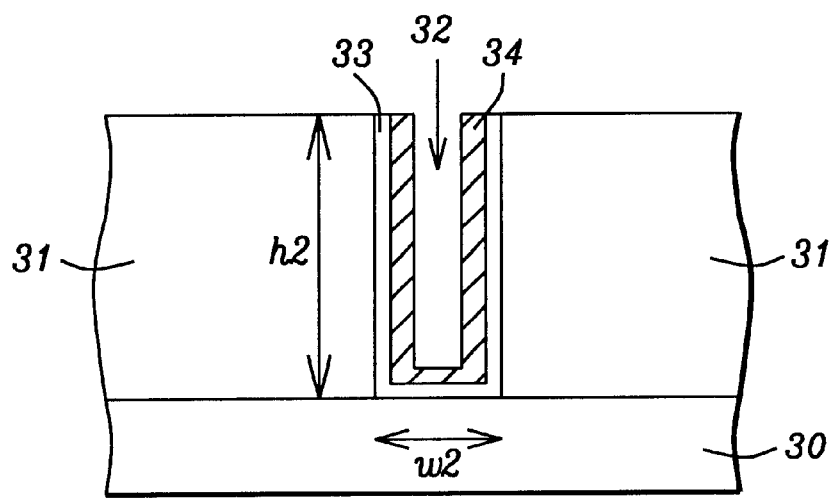
FIG. 2a illustrates an opening in which a silicon layer and a metal seed layer have been deposited according to an embodiment of the present invention.

Referring to FIG. 2a, a substrate 30 is provided which is typically silicon but may also be silicon-germanium, gallium-arsenide, or a silicon-on-insulator (SOI) substrate. Substrate 30 may also be comprised of a substructure (not shown) that can include conductive and dielectric layers as well as active and passive devices. Optionally, an etch stop layer (not shown) comprised of a material like silicon nitride or silicon oxynitride may be formed on substrate 30. A dielectric layer 31 selected from a group including $SiO_2$, carbon doped $SiO_2$, and other dielectric materials having a high thermal stability is deposited by a CVD technique. A via hole 32 is formed in layer 30 by a conventional method that usually involves patterning a photoresist layer (not shown) and using the photoresist as an etch mask during a plasma etch to transfer the pattern through layer 31. Via hole 32 has a depth h2 that ranges from about 3000 to 5000 Angstroms and a width w2 that is normally sub-micron in size and can be as small as 2000 Angstroms or less.

A film of silicon 33 approximately 500 to 1000 Angstroms thick is grown on the sidewalls of via hole 32 by a CVD technique using $SiCl_4$ as a source gas in a gas mixture including hydrogen. A seed material 34 comprised of a metal selected from a group including Ni, Ti, Co, and W and an alloy of one of the aforementioned metals is then deposited on silicon layer 33 in hole 32 by an electroless plating process to give a metal film thickness within hole 32 in the range of between 500 and 1000 Angstroms. Other metals that can readily form a silicide layer can also be used. The ratio of metal in layer 34 to silicon in layer 33 is intentionally made slightly larger than 1. Note that layers 33, 34 fill most of hole 32. Although a high quality and low cost seed material is formed by electroless plating, other methods can also be employed to form the seed layer 34. The substrate 30 is cleaned by a solution comprising water following the electroplating to ensure that the metal surface within hole 32 is free of chemicals prior to the next step.

Figure 2B:
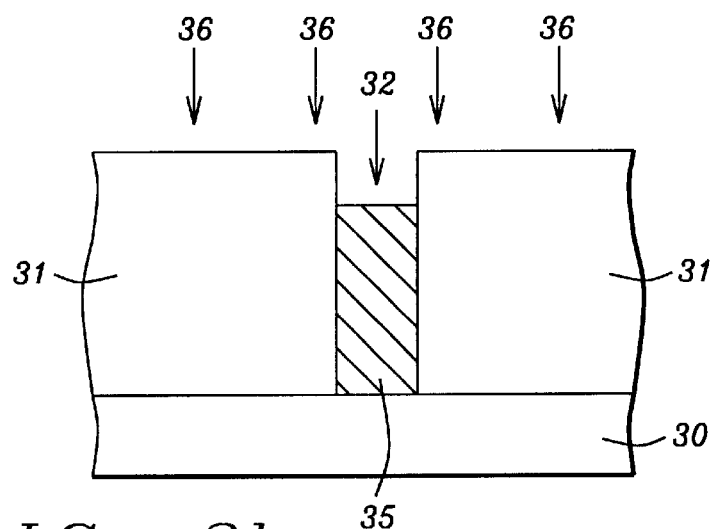
FIG. 2b shows the opening in FIG. 2a after the Si and seed layers have been reflowed.

Referring to FIG. 2b, the silicon layer 33 and seed material 34 are reflowed to a liquid state 35 comprised of a silicide by a thermal treatment that involves heating the substrate 30 in a furnace chamber under an inert gas ambient that is preferably argon to a temperature in the range of about 700° C. to 1500° C. for a period of about 10 to 60 seconds. Liquid metal 35 then serves as a seed for a subsequent VLS growth to form a silicide whisker that may be a single crystal in this case.

A silicon precursor gas 36 is applied in a CVD chamber containing substrate 30. For example, $SiCl_4$ at a flow rate of 250 to 400 sccm and $H_2$ at a flow rate of 50 to 100 sccm are introduced into the chamber at a pressure of between about 0.4 and 0.6 Torr and with a temperature in the range of about 700° C. to 1500° C. Other silicon source gases such as $SiCl_2H_2$ can be used in combination with $H_2$. The silicon deposition decreases the metal/silicon ratio that was originally greater than 1.

Figure 2C:
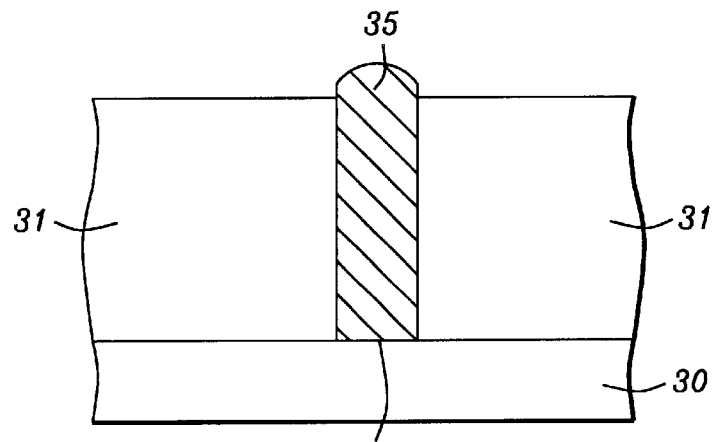
FIG. 2c depicts the opening in FIG. 2b after growth of the silicide layer by a VLS process.

In FIG. 2c, the VLS growth process is continued until the target ratio of metal/silicon in suicide 35 is reached. Silicide 35 completely fills the hole 32 and grows above the top of the hole. This process usually requires a time period of several seconds to several minutes. As a result, a silicide whisker 35 is formed that is free of seams or defects which is an improvement over other methods such as conventional CVD that has a tendency to form seams and voids during the deposition process. Silicide growth by a VLS process is able to form a single whisker with a high aspect ratio (h2/w2). Because of the defect reduction, there are fewer substrates that must be reworked or scrapped and the resulting yield is higher.

Figure 2D:
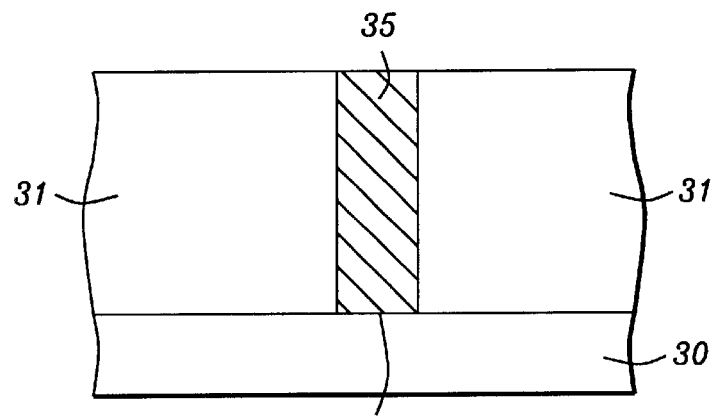
FIG. 2d shows that the silicide layer in FIG. 2c has been planarized.

Referring to FIG. 2d, an optional step that removes the silicide overgrowth to provide a level of silicide 35 that is coplanar with the top of hole 32 is shown. Planarization can be achieved by one of two methods. A CMP technique that is commonly used in dual damascene fabrication can be employed. Otherwise, an etch step consisting of a chemical solution that selectively removes silicide is used to lower the silicide overgrowth.

This method can be readily implemented in manufacturing since it makes use of existing tools and processes including electroplating, CVD, CMP, and high temperature baking techniques.

While this invention has been particularly shown and described with reference to, the preferred embodiments thereof, it will be understood by those skilled in the art that various changes in form and details may be made without departing from the spirit and scope of this invention.

We claim:

1. A method of filling a trench with silicon comprising:
    (a) providing a substrate upon which a silicon layer has been deposited, said layer containing a trench;
    (b) depositing a layer of silicon nitride on the sidewalls of said trench and a layer of silicon oxide on said nitride layer;
    (c) growing a thin film of silicon on said oxide layer in said trench;
    (d) depositing a layer of seed material on said thin silicon layer;
    (e) reflowing the seed material to a liquid by a heat treatment; and
    (f) applying a silicon precursor gas to grow a silicon whisker.

2. The method of claim 1 wherein the silicon nitride layer has a thickness between about 30 and 40 Angstroms and wherein the silicon oxide layer has a thickness between about 10 and 20 Angstroms.

3. The method of claim 1 wherein said thin film of silicon is deposited by a CVD process to a thickness between about 50 and 100 Angstroms and is doped with arsenic to a concentration between about $1 \times 10^{22}$ and $3 \times 10^{22}$ ions/cm$^3$.

4. The method of claim 1 wherein the seed material is Au, Ni, Co or an alloy of one of the aforementioned metals.

5. The method of claim 1 wherein the seed material is deposited by an electroless plating process.

6. The method of claim 1 wherein the seed material layer has a thickness in the range of about 50 to 100 Angstroms.

7. The method of claim 1 wherein the heat treatment comprises heating the substrate in a furnace chamber with an argon ambient in a temperature range of about 500° C. to 1000° C. for about 10 to 60 seconds.

8. The method of claim 1 wherein the silicon whisker is grown in a CVD chamber using conditions comprised of a $SiCl_4$ flow rate between 250 and 400 standard cubic centimeters per minute (sccm), a hydrogen flow rate between 50 and 100 sccm, a temperature from about 500° C. to 1000° C. and a pressure from about 0.04 to 0.4 Torr.

9. The method of claim 1 wherein the precursor gas is a mixture of $SiCl_4$ and $H_2$.

10. A method of filling an opening with a silicide comprising:
    (a) providing a substrate with a dielectric layer formed thereon, said dielectric layer containing an opening;
    (b) depositing a silicon layer on the wall of said opening;
    (c) depositing a seed material on said silicon layer in said opening;

(d) reflowing the seed material and silicon layer to a liquid by a heat treatment to form a silicide; and (e) applying a silicon precursor gas to grow said silicide layer.

11. The method of claim 10 wherein said opening has a depth from about 3000 to 5000 Angstroms and a width as small as 2000 Angstroms or less.

12. The method of claim 10 wherein the silicon layer is deposited to a thickness of between about 500 and 1000 Angstroms.

13. The method of claim 10 wherein the seed material is Ni, Ti, Co, W, or an alloy of one of the aforesaid metals.

14. The method of claim 10 wherein the seed material is deposited by an electroless plating process.

15. The method of claim 10 wherein the seed material is deposited to a thickness of about 500 to 1000 Angstroms.

16. The method of claim 10 wherein the ratio of metal in said seed material to silicon in said silicon layer is larger than 1.

17. The method of claim 10 wherein the heat treatment comprises heating the substrate in a furnace chamber with an argon ambient in a temperature range of about 700° C. to 1500° C. for about 10 to 60 seconds.

18. The method of claim 10 wherein the silicide is grown in a CVD chamber using conditions comprised of a $SiCl_4$ flow rate between 250 and 400 sccm, a hydrogen flow rate between 50 and 100 sccm, a temperature from about 700° C. to 1500° C. and a pressure from about 0.4 to 0.6 Torr.

19. The method of claim 18 wherein the deposition continues until the metal/silicon ratio in said silicide reaches a target value.

20. The method of claim 10 wherein the precursor gas is a mixture of $SiCl_4$ and $H_2$.

* * * * *